(12) United States Patent
Ke et al.

(10) Patent No.: US 9,406,516 B2
(45) Date of Patent: Aug. 2, 2016

(54) HIGH-K METAL GATE PROCESS FOR LOWERING JUNCTION LEAKAGE AND INTERFACE TRAPS IN NMOS TRANSISTOR

(71) Applicant: UNITED MICROELECTRONICS CORP., Hsin-Chu (TW)

(72) Inventors: Jian-Cun Ke, Tainan (TW); Chih-Wei Yang, Kaohsiung (TW); Kun-Yuan Lo, Tainan (TW); Chia-Fu Hsu, Tainan (TW); Shao-Wei Wang, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/680,078

(22) Filed: Apr. 7, 2015

(65) Prior Publication Data

US 2015/0214060 A1    Jul. 30, 2015

Related U.S. Application Data

(62) Division of application No. 14/023,475, filed on Sep. 11, 2013, now abandoned.

(51) Int. Cl.
| | | |
|---|---|---|
| *H01L 21/02* | (2006.01) | |
| *H01L 21/28* | (2006.01) | |
| *H01L 29/49* | (2006.01) | |
| *H01L 29/51* | (2006.01) | |
| *H01L 29/78* | (2006.01) | |
| *H01L 21/8238* | (2006.01) | |
| *H01L 29/66* | (2006.01) | |
| *H01L 29/165* | (2006.01) | |

(52) U.S. Cl.
CPC .... *H01L 21/28088* (2013.01); *H01L 21/28185* (2013.01); *H01L 21/28194* (2013.01); *H01L 21/28202* (2013.01); *H01L 21/823828* (2013.01); *H01L 21/823857* (2013.01); *H01L 29/4966* (2013.01); *H01L 29/518* (2013.01); *H01L 29/6659* (2013.01); *H01L 29/66545* (2013.01); *H01L 29/7833* (2013.01); *H01L 29/7834* (2013.01); *H01L 29/165* (2013.01); *H01L 29/665* (2013.01); *H01L 29/6656* (2013.01)

(58) Field of Classification Search
CPC ................ H01L 21/28088; H01L 21/823842
USPC ........................................ 257/411; 438/142
See application file for complete search history.

(56) References Cited

U.S. PATENT DOCUMENTS

| | | |
|---|---|---|
| 5,892,282 A | 4/1999 | Hong |
| 6,066,533 A | 5/2000 | Yu |
| 6,096,659 A | 8/2000 | Gardner |
| 6,177,303 B1 | 1/2001 | Schmitz |
| 6,303,418 B1 | 10/2001 | Cha |
| 6,458,684 B1 | 10/2002 | Guo |
| 6,492,217 B1 | 12/2002 | Bai |
| 6,552,377 B1 | 4/2003 | Yu |

(Continued)

*Primary Examiner* — Truong Q Dang
*Assistant Examiner* — Patricia Reddington
(74) *Attorney, Agent, or Firm* — Winston Hsu; Scott Margo

(57) ABSTRACT

A method for fabricating semiconductor device is disclosed. The method includes the steps of: providing a substrate; forming an interfacial layer on the substrate; forming a high-k dielectric layer on the interfacial layer; forming a first bottom barrier metal (BBM) layer on the high-k dielectric layer; performing a thermal treatment; removing the first BBM layer; and forming a second BBM layer on the high-k dielectric layer.

11 Claims, 5 Drawing Sheets

(56) References Cited

U.S. PATENT DOCUMENTS

| | | |
|---|---|---|
| 6,573,134 B2 | 6/2003 | Ma |
| 6,696,345 B2 | 2/2004 | Chau |
| 6,790,719 B1 | 9/2004 | Adetutu |
| 6,794,234 B2 | 9/2004 | Polishchuk |
| 6,902,969 B2 | 6/2005 | Adetutu |
| 6,921,711 B2 | 7/2005 | Cabral, Jr. |
| 6,960,416 B2 | 11/2005 | Mui |
| 7,030,430 B2 | 4/2006 | Doczy |
| 7,074,664 B1 | 7/2006 | White |
| 7,109,079 B2 | 9/2006 | Schaeffer, III |
| 7,126,199 B2 | 10/2006 | Doczy |
| 7,144,783 B2 | 12/2006 | Datta |
| 7,148,548 B2 | 12/2006 | Doczy |
| 7,153,784 B2 | 12/2006 | Brask et al. |
| 7,157,378 B2 | 1/2007 | Brask |
| 7,176,090 B2 | 2/2007 | Brask |
| 7,186,605 B2 | 3/2007 | Cheng |
| 7,193,893 B2 | 3/2007 | Forbes |
| 7,208,361 B2 | 4/2007 | Shah |
| 7,208,366 B2 | 4/2007 | Tsai |
| 7,217,611 B2 | 5/2007 | Kavalieros |
| 7,355,281 B2 | 4/2008 | Brask |
| 7,381,619 B2 | 6/2008 | Wang |
| 7,390,709 B2 | 6/2008 | Doczy |
| 7,407,876 B2 | 8/2008 | Ishizaka |
| 7,488,656 B2 | 2/2009 | Cartier |
| 7,531,404 B2 | 5/2009 | Pae et al. |
| 7,556,998 B2 | 7/2009 | Park |
| 7,700,479 B2 | 4/2010 | Huang |
| 7,785,958 B2 | 8/2010 | Doczy |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0024953 A1 | 2/2006 | Papa Rao |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0145591 A1 | 6/2007 | Yano |
| 2007/0148838 A1 | 6/2007 | Doris |
| 2007/0210354 A1 | 9/2007 | Nabatame |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2008/0318371 A1 | 12/2008 | Lin |
| 2009/0057769 A1 | 3/2009 | Wei |
| 2009/0057787 A1 | 3/2009 | Matsuki |
| 2009/0166769 A1 | 7/2009 | Metz |
| 2009/0186458 A1 | 7/2009 | Yu |
| 2010/0044783 A1 | 2/2010 | Chuang |
| 2010/0052074 A1 | 3/2010 | Lin |
| 2010/0065926 A1 | 3/2010 | Yeh |
| 2010/0068877 A1 | 3/2010 | Yeh |
| 2010/0081262 A1 | 4/2010 | Lim |
| 2010/0087055 A1 | 4/2010 | Lai |
| 2010/0124818 A1 | 5/2010 | Lee |
| 2010/0244141 A1* | 9/2010 | Beyer et al. .................. 257/369 |
| 2011/0073964 A1* | 3/2011 | Chowdhury .... H01L 21/823462 257/411 |
| 2011/0254063 A1 | 10/2011 | Chen |
| 2012/0264284 A1* | 10/2012 | Wang et al. .................. 438/592 |
| 2014/0327093 A1* | 11/2014 | Lo et al. ....................... 257/410 |
| 2014/0335685 A1* | 11/2014 | Tsai ................. H01L 21/28088 438/591 |
| 2015/0102416 A1* | 4/2015 | Yin ................. H01L 21/823842 257/369 |

* cited by examiner

HIGH-K METAL GATE PROCESS FOR LOWERING JUNCTION LEAKAGE AND INTERFACE TRAPS IN NMOS TRANSISTOR

CROSS REFERENCE TO RELATED APPLICATIONS

This application is a division of U.S. application Ser. No. 14/023,475 filed Sep. 11, 2013, and incorporated herein by reference in its entirety.

BACKGROUND OF THE INVENTION

1. Field of the Invention

The invention relates to a method for fabricating semiconductor device, and more particularly to a novel high-k metal gate process for lowering junction leakage and interface traps in NMOS transistors.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even after the conventional silicon dioxide or silicon oxynitride gate dielectric layer is replaced by the high-K gate dielectric layer and the conventional polysilicon gate is replaced by the metal gate.

SUMMARY OF THE INVENTION

A method for fabricating semiconductor device is disclosed. The method includes the steps of: providing a substrate; forming an interfacial layer on the substrate; forming a high-k dielectric layer on the interfacial layer; forming a first bottom barrier metal (BBM) layer on the high-k dielectric layer; performing a thermal treatment; removing the first BBM layer; and forming a second BBM layer on the high-k dielectric layer.

According to another aspect of the present invention, a semiconductor device is disclosed. The semiconductor device includes a substrate, a gate structure on the substrate, and a source/drain region in the substrate adjacent to the gate structure. The gate structure includes an interfacial layer and a gate on the interfacial layer, in which the nitrogen concentration of the interfacial layer is less than 10 ppm.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
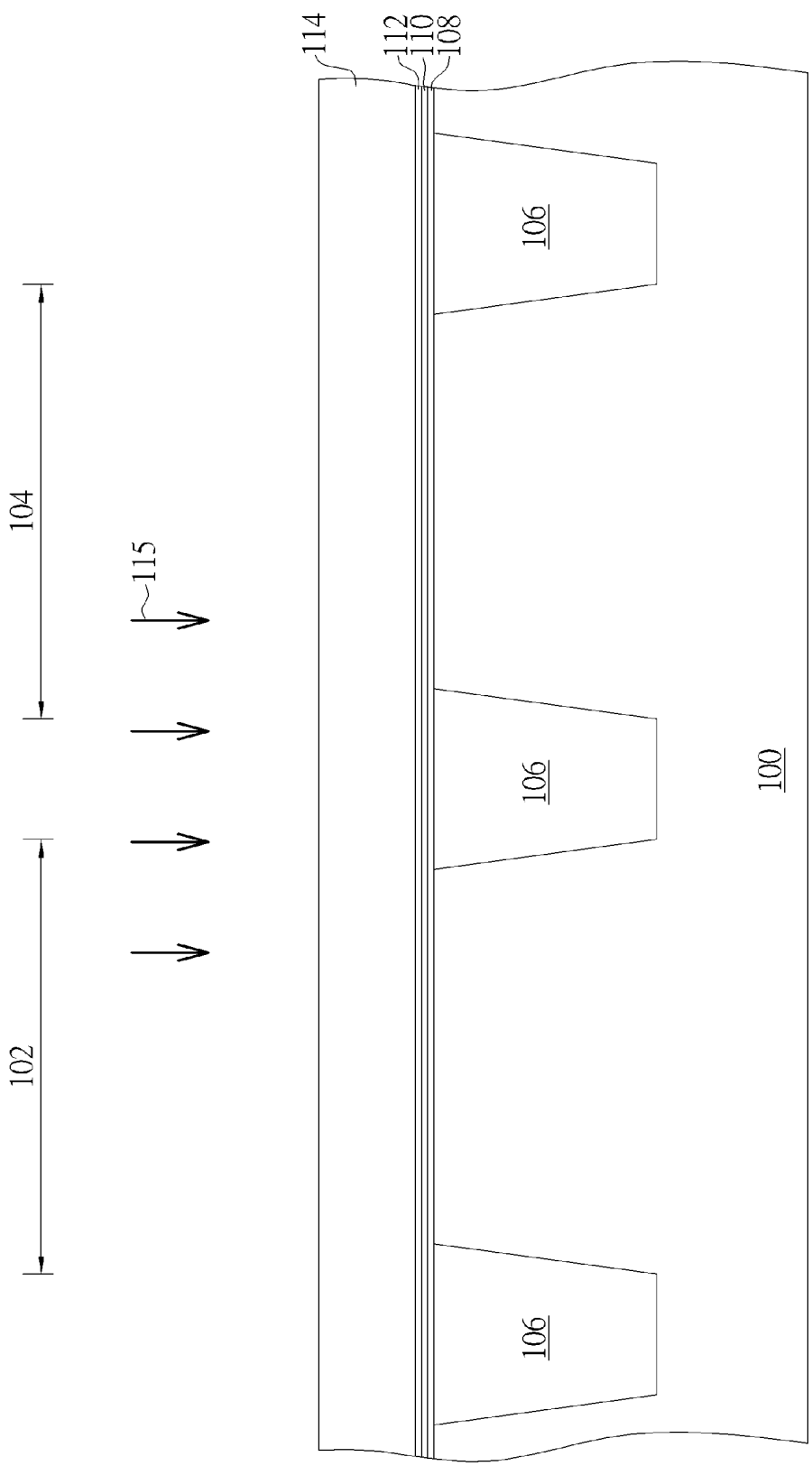
FIGS. 1-4 illustrate a method for fabricating a semiconductor device having metal gate according to a preferred embodiment of the present invention.

Referring to FIGS. 1-4, FIGS. 1-4 illustrate a method for fabricating a semiconductor device having metal gate according to a preferred embodiment of the present invention. In this embodiment, the semiconductor device is preferably a CMOS transistor, in which the method preferably utilizes a gate-last approach accompanying a high-k first fabrication. As shown in FIG. 1, a substrate 100, such as a silicon substrate or a silicon-on-insulator (SOI) substrate is provided. A first region and a second region are defined on the substrate 100, such as a NMOS region 102 and a PMOS region 104. A plurality of shallow trench isolations (STI) 106 are formed in the substrate 100 for separating the two transistor regions.

Next, a pre-clean is carried out to clean the surface of the substrate 100, and an interfacial layer 108 is formed on the substrate 100. The interfacial layer 108 is preferably formed through an in-situ steam generation (ISSG) process, in which the interfacial layer 108 is composed of silicon oxide and the thickness thereof is around 10 Angstroms.

Next, a pre-clean is performed by using standard clean agent SC-1 to clean the surface of the interfacial layer 108 prior to the deposition of high-k material for 300 seconds. A high-k dielectric layer 110 is then deposited on the interfacial layer 108 through an atomic layer deposition (ALD) process. In this embodiment, the high-k dielectric layer 110 could be a single-layer or a multi-layer structure containing metal oxide layer such as rare earth metal oxide, in which the dielectric constant of the high-k dielectric layer 110 is substantially greater than 20. For example, the high-k dielectric layer 110 could be selected from a group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). The thickness of the high-k dielectric layer 110 is preferably around 20 Angstroms.

Next, a bottom barrier metal (BBM) layer 112 is deposited on the high-k dielectric layer 110. Preferably, the BBM layer 112 is composed of TiN, but not limited thereto.

It should be noted that a decoupled plasma nitridation (DPN) process is typically carried out before the deposition of the BBM layer 112. However, in order to prevent that too much nitrogen from diffusing into the interfacial layer 108 and the high-k dielectric layer 110, the DPN process is preferably skipped in this embodiment. By skipping the DPN process prior to the deposition of the BBM layer 112, the negative bias temperature instability (NBTI) of the PMOS region could be improved substantially.

After the BBM layer 112 is deposited, a silicon layer 114 is deposited through chemical vapor deposition (CVD) or physical vapor deposition (PVD) process on top of the BBM layer 112 thereafter to prevent impurities or contaminants from entering the BBM layer 112. Preferably, the silicon layer 114 is composed of amorphous silicon, and the thickness thereof is between 100 Angstroms to 300 Angstroms, and more preferably at around 200 Angstroms.

Next, a thermal treatment 115 is performed to inject nitrogen into the high-k dielectric layer 110 instead of into the interface between the interfacial layer 108 and the high-k dielectric layer 110 thereby reducing interface damage. Preferably, environmental gas such as oxygen and nitrogen could be injected during the thermal treatment process, in which nitrogen gas has found to be the preferable choice. The thermal treatment is carried out between 700-1000° C., and more preferably at 975° C.

Figure 2:
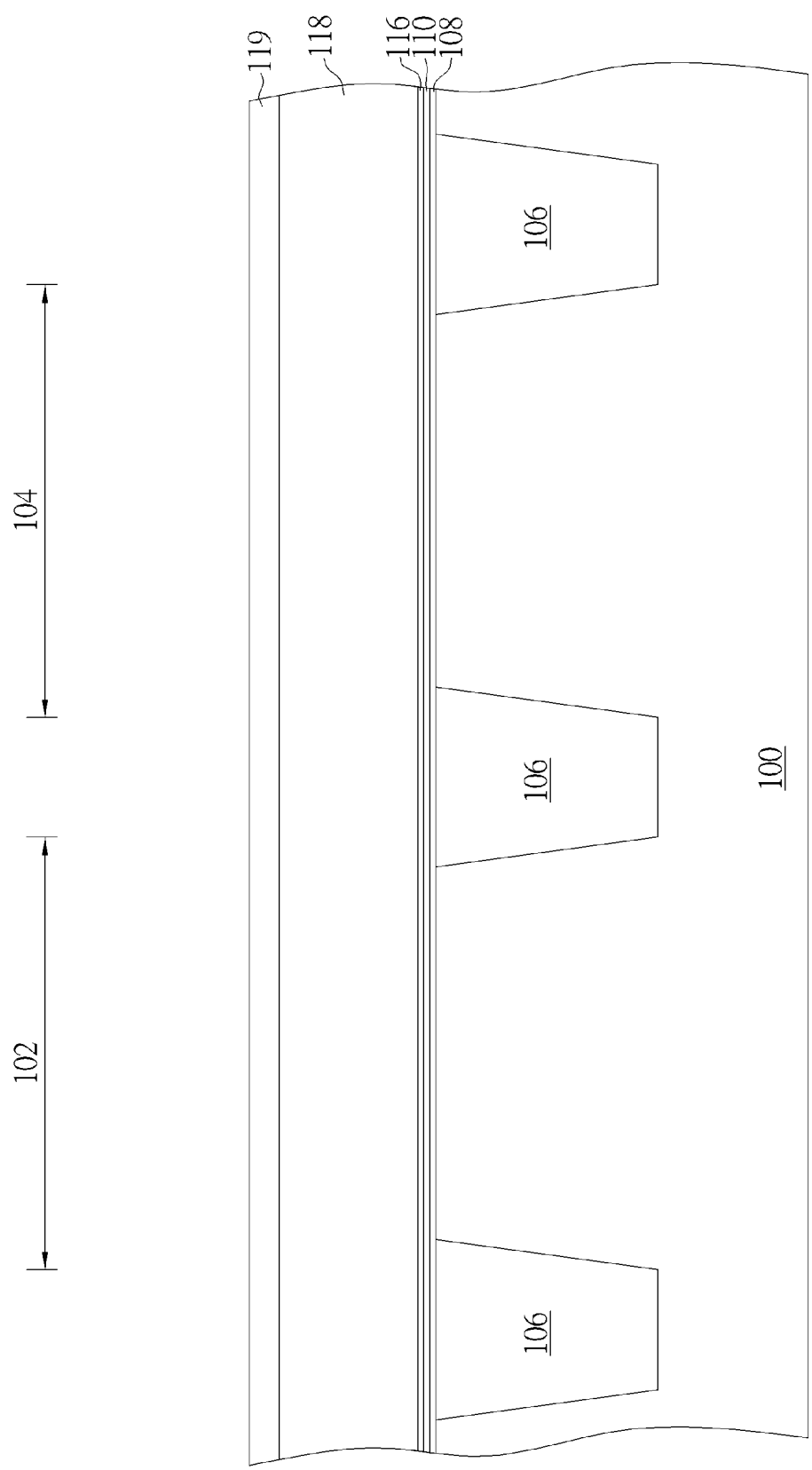

Next, as shown in FIG. 2, the silicon layer 114 and the BBM layer 112 are removed through wet clean process, and another BBM layer 116 is deposited on the high-k dielectric layer 110. The means for depositing the second BBM layer 116 could be the same as the one used for depositing the first BBM layer 112, and the material and the thickness of the second BBM layer 116 could also be identical to that of the first BBM layer 112.

After the second BBM layer 116 is deposited, a sacrificial layer, such as another silicon layer 118 is deposited on the surface of the second BBM layer 116. The second silicon layer 118 could be composed of undoped polysilicon, polysilicon having n+ dopants, or amorphous silicon material, and the thickness thereof is preferably at around 550 Angstroms. After the second silicon layer 118 is formed, a hard mask 119 composed of $SiO_2$, SiN, SiC, or SiON could be deposited on the silicon layer 118 thereafter.

Figure 3:
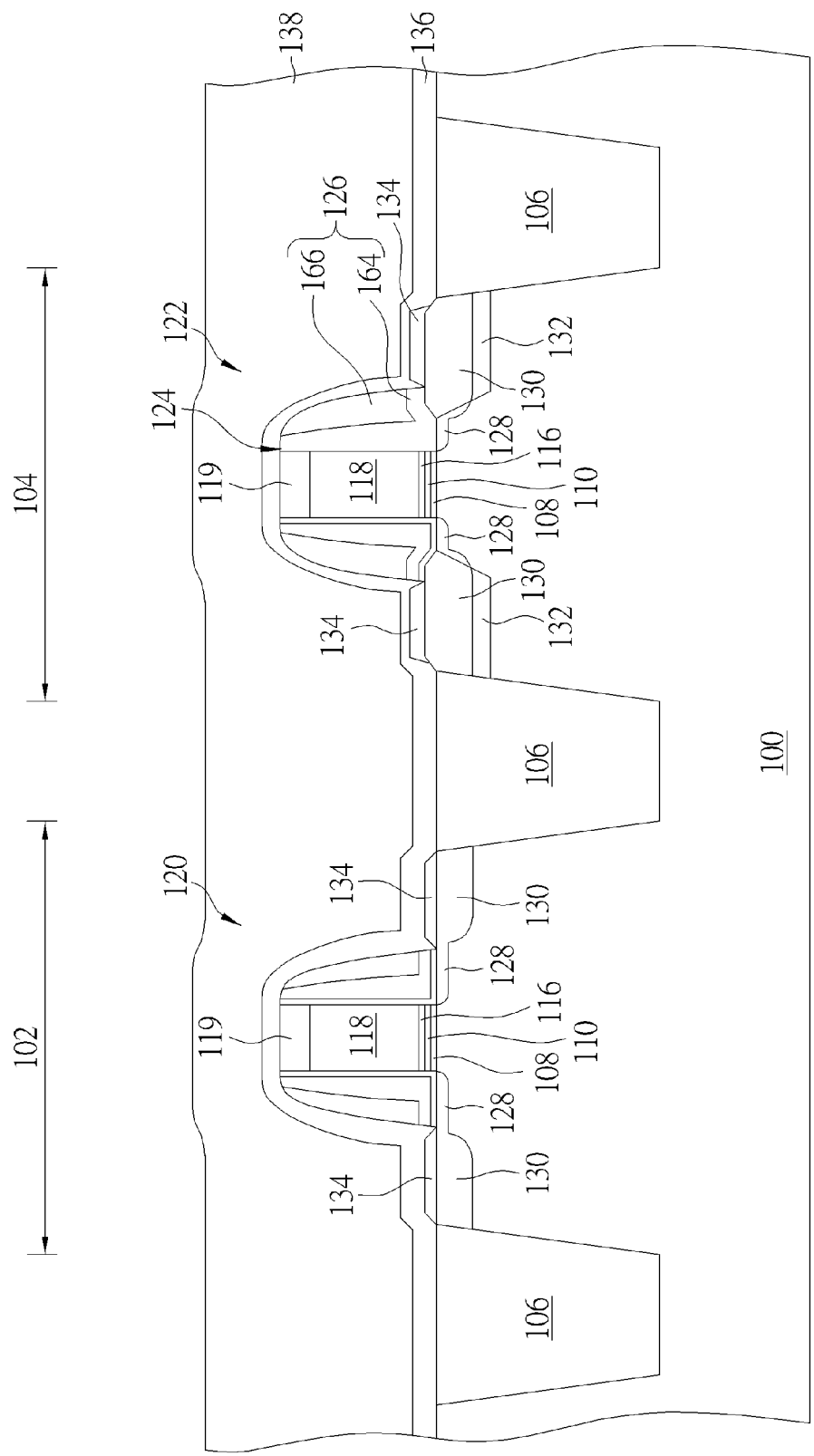

Next, as shown in FIG. 3, a pattern transfer is carried out to partially remove the hard mask, the silicon layer 118, the BBM layer 116, the high-k dielectric layer 110, and the interfacial layer 108 to form two dummy gates, such as a first gate structure 120 and second gate structure 122 in the PMOS region 104 and the NMOS region 102 respectively.

Next, ion implantations are carried out in the PMOS region 104 and the NMOS region 102 to form a lightly doped drain 128 in the substrate 100 adjacent to two sides of the first gate structure 120 and the second gate structure 122, and a spacer 126 is formed on the sidewall of the gate structures 120 and 122, in which the spacer may include an offset spacer 164 and a main spacer 166. After the offset spacer 164 is formed on the sidewall of the first gate structure 120 and second gate structure 122, a selective epitaxial growth process could be carried out to form an epitaxial layer 132 in the substrate 100 adjacent to two sides of the offset spacer 164 of the PMOS region 104, in which the epitaxial layer 132 preferably includes silicon germanium.

After the epitaxial layer 132 is formed, the main spacer 166 is formed on the sidewalls of the offset spacer 164, and another ion implantation is carried out to form a source/drain region 130 in each of the NMOS region 102 and PMOS region 104. It should be noted that even though the ion implantation for the source/drain regions 130 is conducted after the formation of the epitaxial layer 132, the source/drain regions 130 could also be formed before the epitaxial layer 132, which is also within the scope of the present invention.

A salicide process could be performed thereafter by first forming a metal selected from a group consisting of cobalt, titanium, nickel, platinum, palladium, and molybdenum on the epitaxial layer 132 and the source/drain 130, and then using at least one rapid thermal anneal process to react the metal with epitaxial layer 132 and the source/drain 130 for forming a silicide layer 134 on the surface of the epitaxial layer 132 and the source/drain 130 of the NMOS region 102 and the PMOS region 104. The un-reacted metal is removed thereafter.

Next, a contact etch stop layer (CESL) 136 is deposited on the first gate structures 120 and the second gate structures 122, and a process such as flowable chemical vapor deposition, FCVD) is carried out to form an interlayer dielectric (ILD) layer 138 on the CESL 136.

Figure 4:
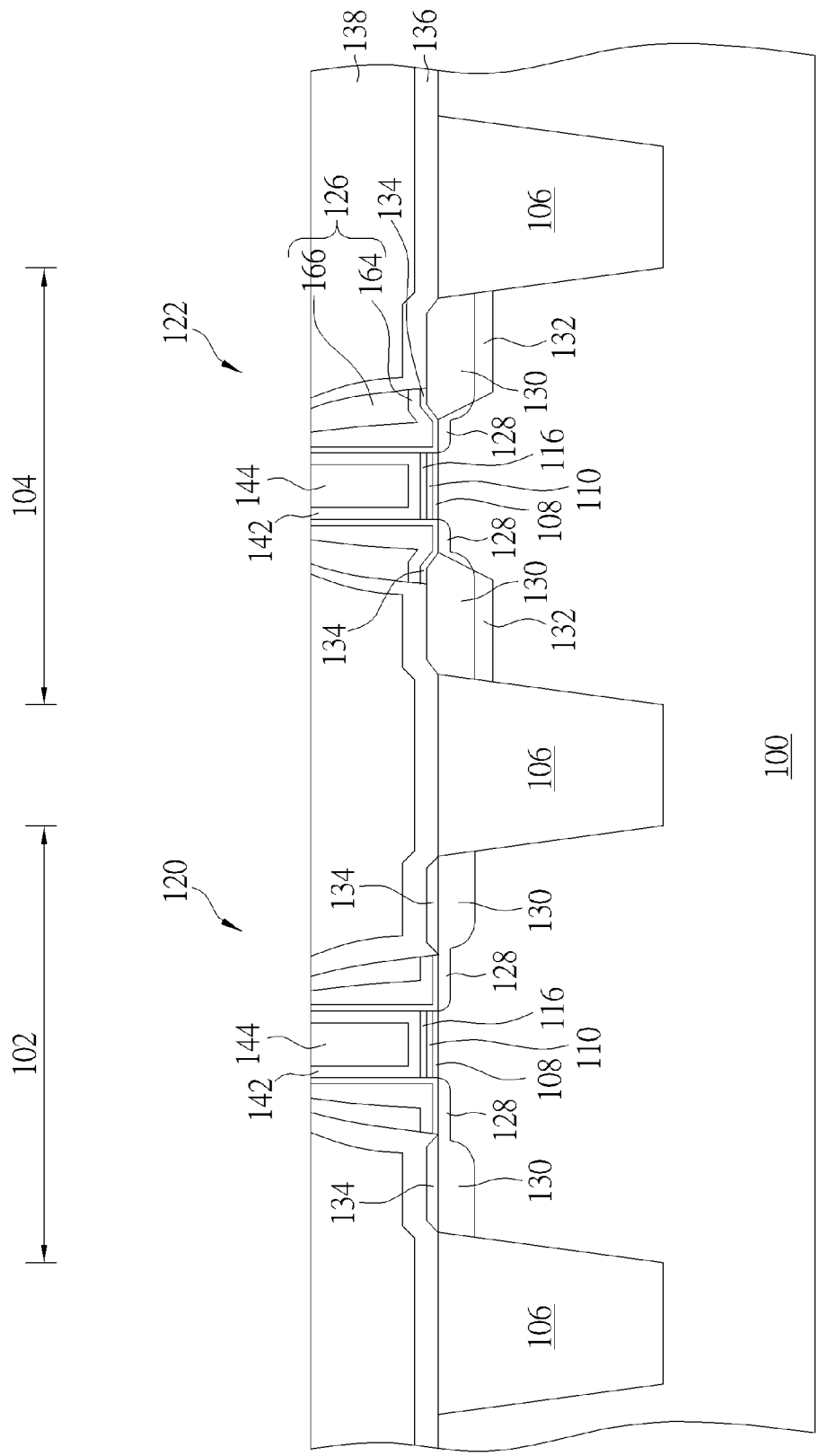

Next, as shown in FIG. 4, a planarizing process, such as a chemical mechanical polishing (CMP) process is performed to partially remove the ILD layer 138, CESL 136, and hard mask 119 so that the top of the dummy gates composed of silicon within the first gate structure 120 and the second gate structure 122 are exposed and substantially even with the surface of the ILD layer 138.

Next, a replacement metal gate (RMG) process is conducted to form a metal gate in each of the NMOS region 102 and PMOS region 122. According to a preferred embodiment of the present invention, the RMG process could be carried out by first performing a selective dry etching or wet etching process, such as using etchants including ammonium hydroxide ($NH_4OH$) or tetramethylammonium hydroxide (TMAH) to remove the silicon layer 118 from the first gate structure 120 and the second gate structure 122 without etching the ILD layer 138 for forming a recess (not shown) in each transistor region 102 and 104.

Next, a work function metal layer 142 and a conductive layer 144 with low resistance material are deposited to fill the recess, and then one or multiple planarizing process, such as a CMP process is carried out to partially remove the conductive layer 144 and work function metal layer 142 to form a first metal gate and second metal gate in the NMOS region 102 and PMOS region 104 respectively. It should be noted that as the present invention pertains to a CMOS device having dual work function metal layers, the fabrication of the work function metal layer 142 in the NMOS region 102 and work function metal layer 142 in the PMOS region 104 are preferably separated. As this approach is well known to those skilled in the art, the details of which is omitted herein for the sake of brevity. Moreover, the aforementioned layers formed in the N/P MOS region could be different according to the demand of the product.

In this embodiment, the p-type work function metal layer is selected from a group consisting of TiN and TaC, but not limited thereto. The n-type work function metal layer is selected from a group consisting of TiAl, ZrAl, WAl, TaAl, and HfAl, but not limited thereto. The conductive layer 144 is selected from a group consisting of Al, Ti, Ta, W, Nb, Mo, Cu, TiN, TiC, TaN, Ti/W, and composite metal such as Ti/TiN, but not limited thereto.

It should be noted that despite the aforementioned embodiment applies to a high-k first process, the present invention could also be applied to a high-k last process, which is also within the scope of the present invention. This completes the fabrication of a semiconductor device according to a preferred embodiment of the present invention.

Overall, the present invention discloses a high-k metal gate process for lowering junction leakage and charge state between the substrate and interface of the device by first skipping a conventional DPN process prior to deposition of the first BBM layer on the high-k dielectric layer, performing a thermal treatment before depositing a silicon layer on the first BBM layer, removing both the silicon layer and the first BBM layer, and then re-depositing a second BBM layer on the high-k dielectric layer. Consequently, the nitrogen concentration of the interfacial layer underneath the high-k dielectric layer could be controlled under 10 ppm.

Figure 5:
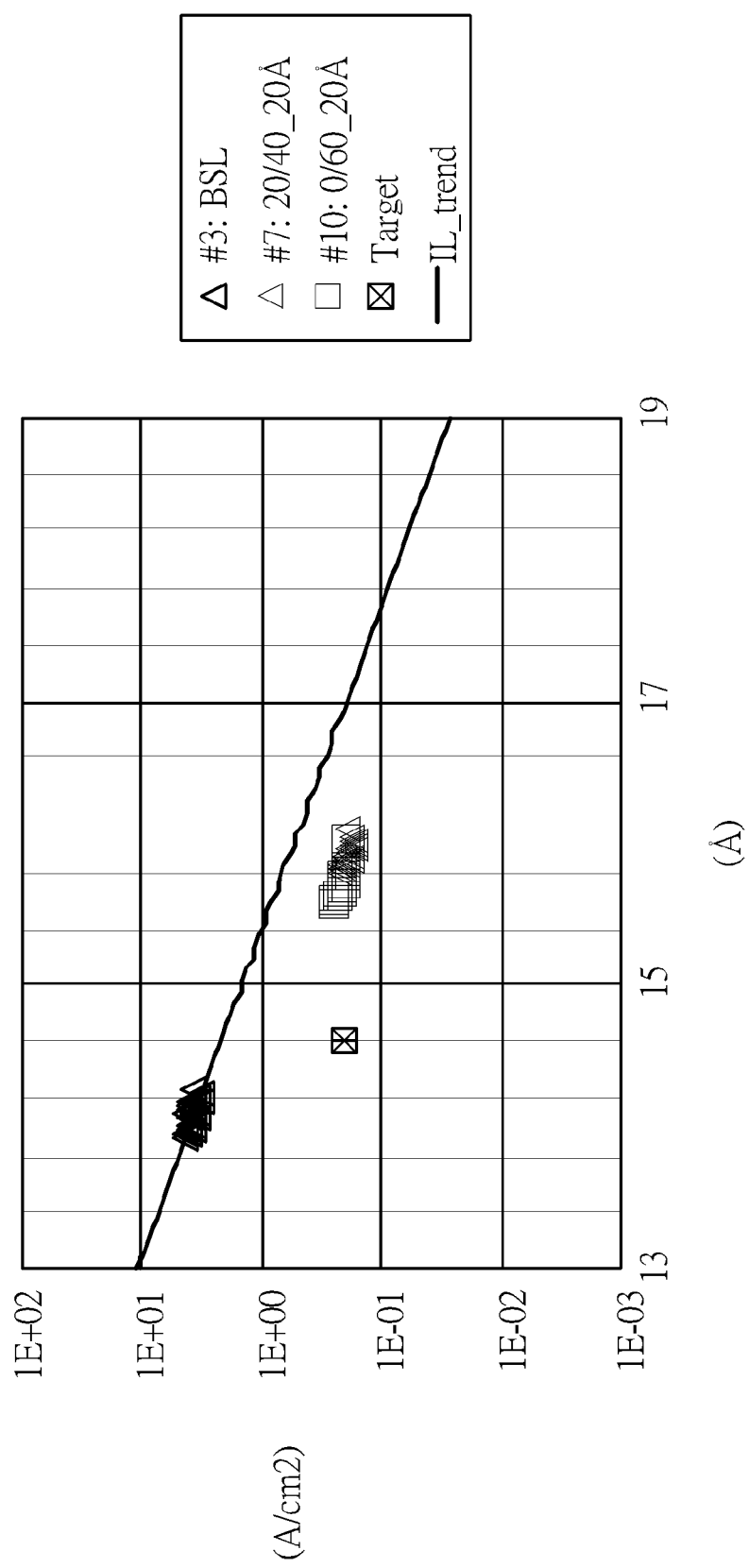
FIG. 5 is a graph illustrating a relationship between junction leakage and interfacial layer thickness in NMOS transistor according to a preferred embodiment of the present invention.

Referring to FIG. 5, which is a graph illustrating a relationship between junction leakage and interfacial layer thickness in NMOS transistor, in which the y-axis indicates the junction leakage of the device while the x-axis indicates the thickness of the interfacial layer. As shown in FIG. 3, the triangular marker with bold outline indicates a baseline process for which conventional DPN process is utilized for fabricating the device. The rectangular marker with a cross embedded inside indicates the target value. A cluster of rectangular and triangular markers situating to the right of the rectangular target marker indicates the result obtained by carrying out the aforementioned steps disclosed above. That is, the steps of skipping the conventional DPN process, depositing a first BBM layer and silicon layer on the high-k dielectric layer, removing both the first BBM layer and the silicon layer, and then re-depositing a second BBM layer and a second silicon layer thereafter. It is evident from the graph that by using the aforementioned process for fabricating the device, the junction leakage of the NMOS transistor is improved substantially.

Preferably, the present invention further discloses a semiconductor device structure fabrication from the aforementioned process, in which the device includes: a substrate, a gate structure on the substrate, and a source/drain region in the substrate adjacent to the gate structure. The gate structure preferably includes an interfacial layer and a gate on the interfacial layer, in which the nitrogen concentration of the interfacial layer is less than 10 ppm. A spacer is formed around the gate structure, and the gate preferably includes a high-k dielectric layer on the interfacial layer, a bottom barrier metal (BBM) layer on the high-k dielectric layer, a work function layer on the BBM layer, and a low resistance metal layer on the work function layer. The BBM layer preferably includes TiN, and the work function layer includes a p-type work function layer or a n-type work function layer depending on the type of the device being fabricated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate;
    forming an interfacial layer on the substrate;
    forming a high-k dielectric layer on the interfacial layer;
    forming a first bottom barrier metal (BBM) layer on the high-k dielectric layer;
    performing a thermal treatment;
    removing the first BBM layer completely;
    forming a second BBM layer on and contact the high-k dielectric layer after removing the first BBM layer completely, wherein the first BBM layer and the second BBM layer comprise same material;
    forming a sacrificial layer on the second BBM layer; and
    patterning the sacrificial layer to form a dummy gate.

2. The method of claim 1, further comprising performing a pre-clean before forming the interfacial layer.

3. The method of claim 1, further comprising:
    forming a spacer on the sidewall of the dummy gate;
    forming a source/drain region in the substrate adjacent to the spacer;
    forming a contact etch stop layer on the dummy gates;
    forming an interlayer dielectric layer (ILD) on the contact etch stop layer; and
    performing a replacement metal gate (RMG) process to form the dummy gate into metal gate.

4. The method of claim 1, wherein the sacrificial layer comprises amorphous silicon or polysilicon.

5. The method of claim 1, wherein the interfacial layer comprises silicon oxide.

6. The method of claim 1, wherein the first BBM layer and the second BBM layer comprise TiN.

7. The method of claim 1, further comprising forming a silicon layer on the first BBM layer before performing the thermal treatment.

8. The method of claim 7, further comprising removing the silicon layer and the first BBM layer before forming the second BBM layer.

9. The method of claim 7, wherein the silicon layer comprises amorphous silicon.

10. The method of claim 7, wherein the thickness of the silicon layer is between 100 Angstroms to 300 Angstroms.

11. The method of claim 1, wherein the temperature of the thermal treatment is between 700-1000° C.

* * * * *